United States Patent [19]

Sorgi

[11] Patent Number: 4,494,073
[45] Date of Patent: Jan. 15, 1985

[54] FREQUENCY GENERATOR USING COMPOSITE DIGITALLY CONTROLLED OSCILLATORS

[75] Inventor: Aladino D. Sorgi, San Diego, Calif.

[73] Assignee: Cubic Corporation, San Diego, Calif.

[21] Appl. No.: 423,605

[22] Filed: Sep. 27, 1982

[51] Int. Cl.³ .................... H03K 3/80; H03B 21/02
[52] U.S. Cl. ................................. 328/14; 307/529;
328/23; 328/27; 328/36; 331/38
[58] Field of Search .................. 307/510, 529, 271;
328/14, 18, 23, 27, 36, 61, 137; 331/38, 40, 47;
375/1

[56] References Cited

U.S. PATENT DOCUMENTS

| | | | |
|---|---|---|---|
| 3,331,035 | 7/1967 | Strickholm | 331/178 |
| 3,665,323 | 5/1972 | Peterson | 328/14 |
| 3,701,027 | 10/1972 | Belton, Jr. | 328/17 |
| 3,702,441 | 11/1972 | Thrower | 328/14 |
| 3,735,269 | 5/1973 | Jackson | 328/14 |
| 3,772,681 | 11/1973 | Skingle | 340/347 |
| 3,838,355 | 9/1974 | Papaieck | 331/39 |
| 3,845,395 | 10/1974 | Murphree | 328/14 |
| 3,956,703 | 5/1976 | Noordanus et al. | 328/14 |
| 4,003,003 | 1/1977 | Haeberlin | 322/11 |
| 4,053,839 | 10/1977 | Knoedl, Jr. | 328/38 |
| 4,068,178 | 1/1978 | Tunzi | 328/14 |
| 4,105,949 | 8/1978 | Hardin | 331/37 |
| 4,134,072 | 1/1979 | Bolger | 328/14 |
| 4,228,403 | 10/1980 | Okumura et al. | 328/15 |
| 4,240,034 | 12/1980 | Lowenschuss | 328/14 |
| 4,283,768 | 8/1981 | Scott | 364/607 |
| 4,285,044 | 8/1981 | Thomas et al. | 328/14 X |
| 4,306,190 | 12/1981 | Beckwith et al. | 328/14 X |
| 4,333,374 | 6/1982 | Okumura et al. | 328/14 X |
| 4,349,704 | 9/1982 | Gillis | 328/27 X |
| 4,349,887 | 9/1982 | Crowley | 328/14 X |

FOREIGN PATENT DOCUMENTS

0077209 6/1980 Japan ..................................... 331/38

OTHER PUBLICATIONS

LaRosa et al., "A Simple Modulator for Sinusoidal Frequency Shift Keying", *IEEE Trans. Comm.* vol. Com-30, No. 5, May 1982, pp. 1048–1051.

*Primary Examiner*—Stanley D. Miller
*Assistant Examiner*—David R. Hudspeth
*Attorney, Agent, or Firm*—Brown, Martin & Haller

[57] ABSTRACT

A frequency generator for generating a large number of closely and evenly spaced frequencies over a large bandwidth including a first digitally controlled oscillator and a second digitally controlled oscillator, and a combiner for mixing the frequencies from said first and second digitally controlled oscillators, wherein the sampling rate of the digitally controlled oscillators differs by a small predetermined amount. Switching speed is extremely rapid.

7 Claims, 5 Drawing Figures

FREQUENCY GENERATOR USING COMPOSITE DIGITALLY CONTROLLED OSCILLATORS

BACKGROUND OF THE INVENTION

The present invention relates to frequency generators. Prior art frequency generators have tried various approaches to provide a large number of frequencies over a wide bandwidth with good resolution and a rapid switching speed. This type of frequency generator is particularly useful in radar applications involving frequency hopping and Doppler signals.

One approach is shown in U.S. Pat. No. 3,956,703. This construction utilizes a phase locked loop. The patent construction provides accuracy of frequencies with fairly good resolution but is too slow to accomplish rapid switching. This construction cannot accomplish close channel spacing. Channel spacing of twenty-five kilohertz is recited in the reference. The patentee obtains a limited number of frequencies. The switching speed varies in the patented device depending upon the closeness of the channels.

U.S. Pat. No. 4,105,949 discloses another approach to frequency generators. This is a cumbersome construction in that it requires a large number of filters. Hundreds of filters are required for generating a large number of frequencies. There is also a noise problem with such an arrangement. This device lacks good resolution. The patented device uses comb filters and cannot obtain the switching speed and desired resolution for an application such as radar. This construction is limited in bandwidth.

SUMMARY

The deficiencies of the prior art are overcome by an exemplary embodiment of the present invention utilizing two digitally controlled oscillators that are sampled at slightly different frequencies and mixed in a combiner to provide a large number of frequencies, spaced closely by the same amount, over a wide band with substantially instant switching.

DETAILED DESCRIPTION OF THE INVENTION

Figure 1:
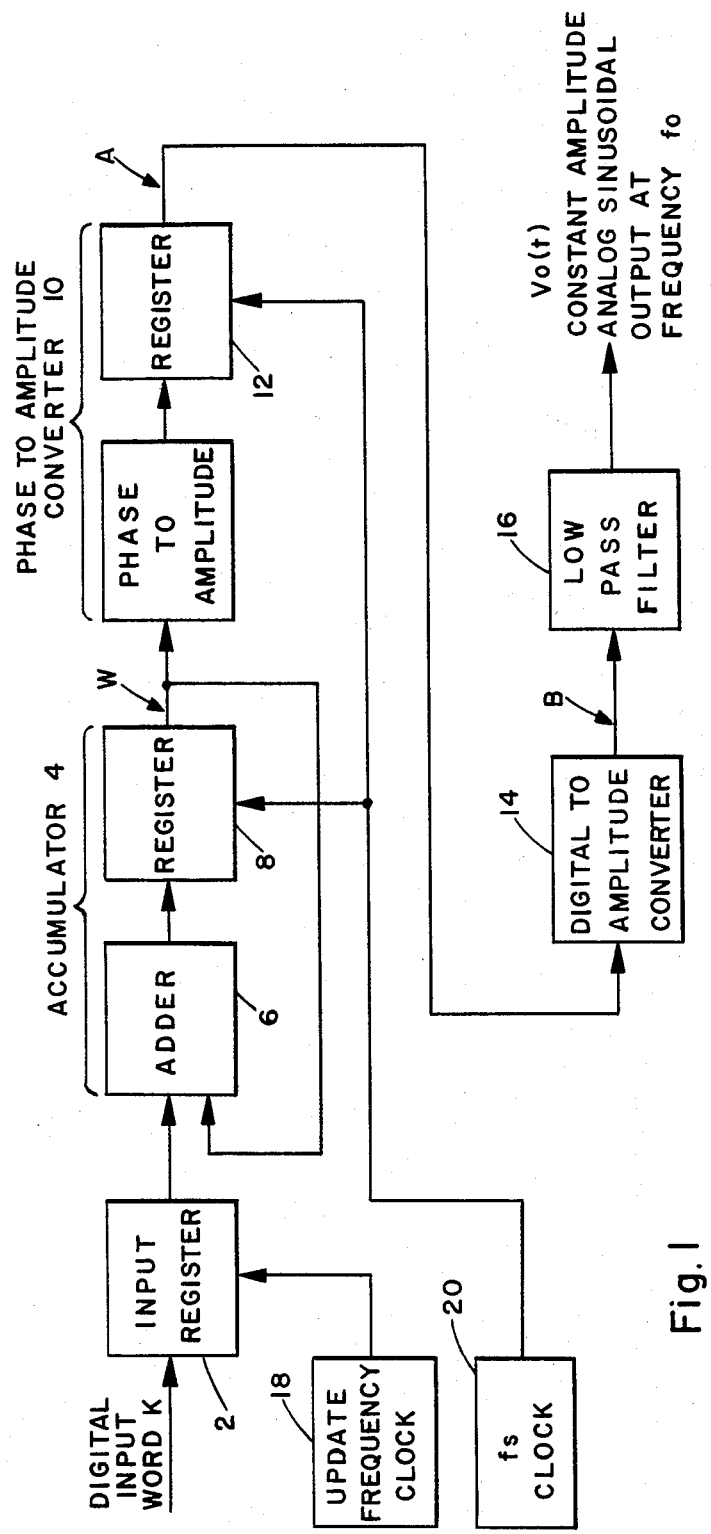
FIG. 1 is a block diagram of a digitally controlled oscillator.

The frequency generator of the present invention generates a large number of frequencies $N_c$ with extremely small equal frequency spacing $\delta$ over a given bandwidth $BW_c$. Two digitally controlled oscillators (DCOs) are used. A digitally controlled oscillator is shown in U.S. Pat. No. 3,772,681. A digitally controlled oscillator having low spurs and high switching speeds is preferred such as the digitally controlled oscillator developed by Cubic Corporation of San Diego, Calif.

For purposes of the general discussion, these digitally controlled oscillators will be referred to as "DCO-1" and "DCO-2". Their characteristics are as follows:

$f_{s1}$ = sample frequency of DCO-1
$BW_1$ = available bandwidth of DCO-1
$N_1$ = number of frequencies in $BW_1$
$f_{o1}$ = output frequency of DCO-1
$f_{s2}$ = sample frequency of DCO-2
$BW_2$ = available bandwidth of DCO-2
$N_2$ = number of frequencies in $BW_2$
$f_{o2}$ = output frequency of DCO-2
$R$ = DCO-1 and DCO-2 register size
$K$ = digital number
$K_1$ = digital control number to generate a particular frequency from DCO-1
$K_2$ = digital control number to generate a particular frequency from DCO-2
$f_o$ = output frequency of the frequency generator (combiner output)
$BW_c$ = frequency generator bandwidth where all $f_o$ frequencies are spaced by $\delta$
$N_c$ = number of frequencies in frequency generator output spaced by $\delta$ Hz.

A large number of frequencies $N_c$ with extremely small equal frequency spacing $\delta$ over a given bandwidth $BW_c$ is provided at the output of the frequency generator.

Each digitally controlled oscillator is operated with a different sample rate $f_s$ such that the relationship between the frequency spacing of the two digitally controlled oscillators becomes $$\Delta f_1 = \Delta f_2 + \delta \tag{1}$$

where $\Delta f_1$ = frequency spacing of DCO-1
$\Delta f_2$ = frequency spacing of DCO-2

Since $$\Delta f_1 = f_{s1}/R \tag{2}$$

and $$\Delta f_2 = f_{s2}/R \tag{3}$$

then the relationship of the two DCO sample frequencies to $\delta$ as given in (1) becomes $$f_{s1} = f_{s2} + R\delta \tag{4}$$

The bandwidth of the two DCO's can be made any value less than half its DCO sample frequency. Arbitrarily to easily explain this invention, $f_{s2}$ will be held constant and $f_{s1}$ will be adjusted above $f_{s2}$ to set the value of $\delta$; and, $BW_2$ will be set equal to a fourth of its sample frequency where the DCO filters, required to maintain low frequency spurs, are still feasible designs. Then, $$BW_2 = f_{s2}/4 \tag{5}$$

and $$BW_1 \leq f_{s1}/4 \tag{6}$$

PS since arbitrarily $$f_{s1} \geq f_{s2} \tag{7}$$

By adjusting $f_{s1}$ the difference $\delta$ between the frequency spacing DCO-1 and DCO-2 is so selected that the frequency lines of DCO-1 will align p times with the frequency lines of DCO-2 within the available bandwidth $BW_2$ (see FIG. 4b) or $$BW = BW_1 = p(m-1)\Delta f_1 \quad (8)$$

and $$BW = BW_2 = pm\Delta f_2 \quad (9)$$

where both available bandwidths $BW_1$ and $BW_2$ are equal and are designated as BW. The symbol p must be a number greater than zero and is not necessarily restricted to being an integer. The symbol m equals an integer which is related to $N_1$ and $N_2$ by the equations $$N_1 = p(m-1) \quad (10)$$

and $$N_2 = pm \quad (11)$$

From equation (8) and (9) the relationship between the frequency spacings of the two DCOs and m becomes $$(m-1)/m = \Delta f_2/\Delta f_1 \quad (12)$$

Relating the expressions in (2) and (3) to (12) shows the relationship between m and the DCO sample frequencies $$(m-1)/m = f_{s2}/f_{s1} \quad (13)$$

With equation (12) substituted into (1) the spacing $\delta$ can be related to m and either of the DCO frequency spacing values for DCO-1 and DCO-2. With this substitution, $$\delta = \Delta f_2/(m-1) \quad (14)$$

and $$\Delta = \Delta f_1/m \quad (15)$$

For convenience equation (9) can be rewritten as $$m = BW/(p\Delta f_2) \quad (16)$$

Now, the relationship between and p can be expressed using equation (14) and (16) as $$\delta = p(\Delta f_2)^2/(BW - p\Delta f_2) \quad (17)$$

An additional relationship between $\delta$ and p can be obtained by substituting (BW/m) for $p\Delta f_2$ in equation (17), using identity (13), the expression in (3), and the bandwidth given in (5) to yield $$\delta = 4pf_{s1}/R^2 \quad (18)$$

Solving equation (17) for p and substituting into this expression equations (5) and the expressions for $\delta$ found from equation (1), the relationship for p becomes $$p = \frac{f_{s2}/4\Delta f_2}{1 + \frac{\Delta f_2}{\Delta f_1 - \Delta f_2}} \quad (19)$$

When each of the $N_2$ frequencies of DCO-2 is combined with the $N_1$ frequencies of DCO-1 with a mixer in a frequency up converter (herein referred to as the "combiner"), a large number of frequencies $(N_c >> N_1 \approx N_2)$ are produced with a spacing of $\delta$. The output of the combiner is described as $$f_o = f_{o1} + f_{o2} = (K_1 f_{s1}/R) + (K_2 f_{s2}/R) \quad (20)$$

By using equation (4), equation (20) can be rewritten as $$f_o = (K_1 + K_2)(f_{s2}/R) + K_1 \delta \quad (21)$$

with the bandwidths for the DCO's as given by equation (5) and (6), the values of $K_1$ and $K_2$ are bounded by $$(R/8) < K_1 < (3R/8) \quad (22)$$

and $$(R/8) \leq K_2 \leq (3R/8) \quad (23)$$

The size of the combined spectrum $BW_c$ at the output of the combiner where all frequencies produced by $K_1$ and $K_2$ are spaced by $\delta$ Hertz by observation becomes $$BW_c > 2BW[1 - (1/p)] \quad (24)$$

By being conservative and forcing the greater than sign in equation (24) to an equal sign, the number of frequencies $N_c$ within the spectrum $BW_c$ becomes $$N_c = (2BW/\delta)[1 - (1/p)] \quad (25)$$

The combined spectrum width $BW_c$ and the number of frequencies $N_c$ at the generator output are related to p by equation (24) and (25). Equation (19) shows that with $\Delta f_2$ fixed at a desired value, then p is related only to $\Delta f_1$ and correspondingly to $\delta$. As p becomes small $\delta$ also becomes small. At the point when p=1 the generator output frequency spacing $\delta$ is extremely small but it exists over a very small bandwidth close to zero. As p increases to the value 2 the frequency spacing $\delta$ increases but its value is still very small; but, now the spacing $\delta$ exists over the bandwidth BW. As p continues to get larger the frequency spacing $\delta$ becomes larger but the frequency spacing exists over a bandwidth larger than BW with the bandwidth limiting at 2BW. When a spectrum is doubled using a multiplying scheme, the spurious level increases by a 6 dB over the level existing at the input to the multiplier. In this proposed system with the generator bandwidth set at 2BW, the combined spectrum is doubled without this 6 dB level increase.

To demonstrate the proposed system, the desired bandwidth at the output of the combined digitally controlled oscillator is set as an example for $$BW_c = BW_1 = BW_2 = BW = 5 \text{ MHz} \quad (26)$$

Using these values in equation (24) sets p=2 with no multiplication of the DCO-1 and DECO-2 bandwidths. From equation (5)

$$f_{s2} = 20 \text{ MHz} \quad (27)$$

Given that R equals 2048 then from equation (3)

$$\Delta f_2 = 9.766 \text{ KHz} \qquad (28)$$

from equation (17) the value of δ becomes $$TI\ \delta = 38.3 \text{ Hz} \qquad (29)$$

From equation (25) the number of frequencies spaced by δ at the generator output becomes $$N_c = 130,560 \qquad (30)$$

which is produced from two digitally controlled oscillators with $N_1 = N_2 = 512$ possible frequencies. The sample frequency of DCO-1 from equation (4) becomes $$f_{s1} = 20.078431 \text{ MHz} \qquad (31)$$

or $f_{s1}$ is 78.431 KHz higher than the sample frequency $f_{s2}$.

In summary, the composite digitally controlled oscillator produces 130,560 frequencies in a 5 Megahertz bandwidth with a spacing of 38.3 Hertz. Since the synthesizer design has a multiplication of four, the frequency spacing at the output of the synthesizer is 153.2 Hertz.

Figure 4A:
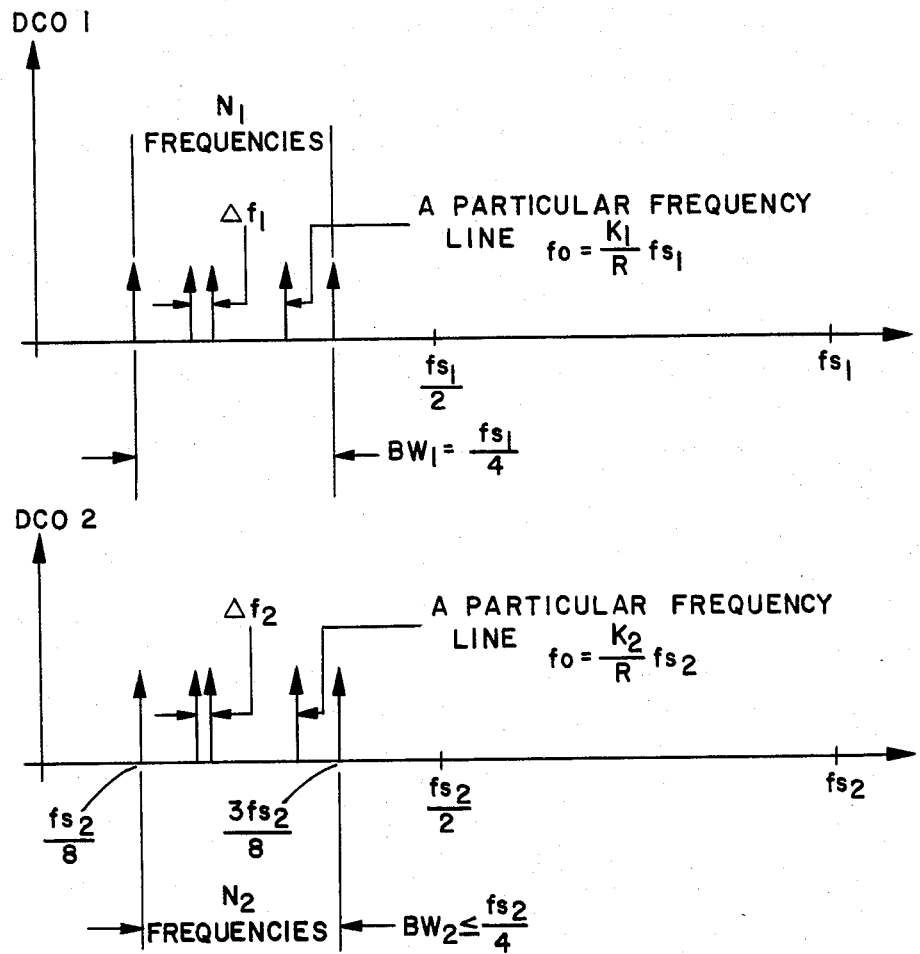
FIG. 4a is a frequency diagram demonstrating the operation of the digitally controlled oscillators used in the present invention.
Figure 4:
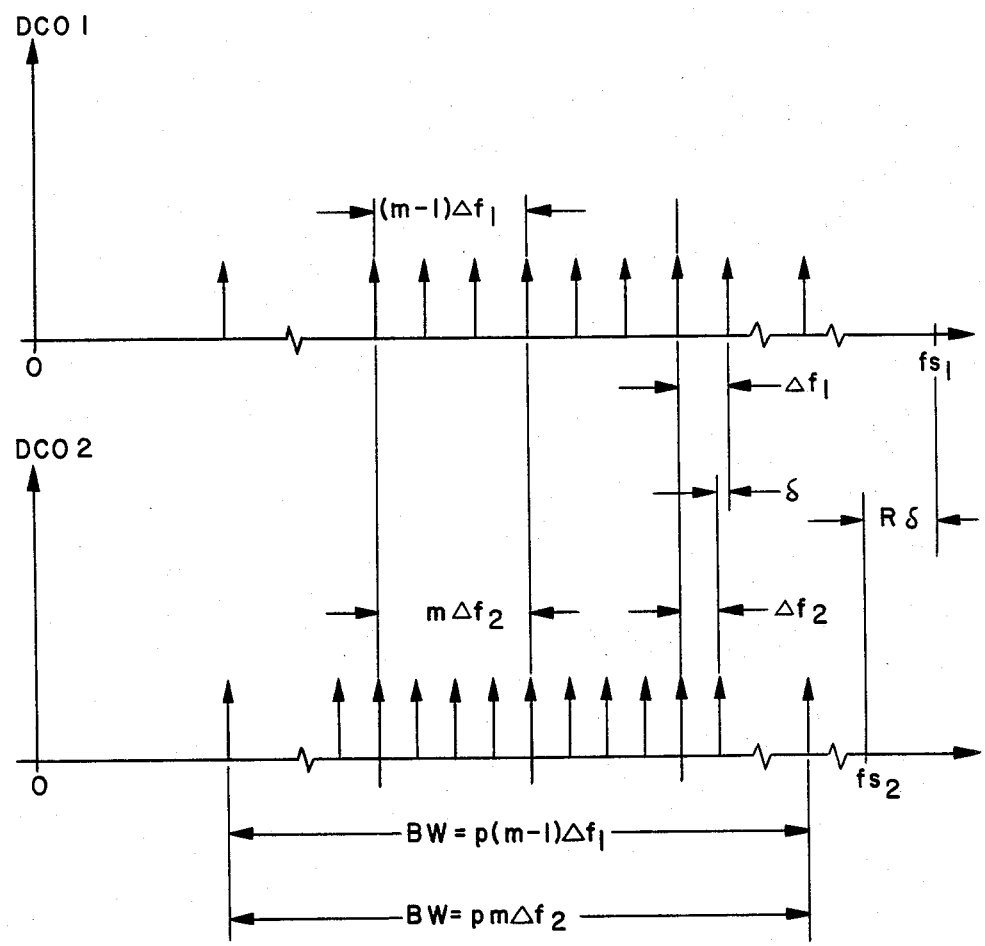
FIG. 4b is a frequency diagram showing the detail relationship between DCO-1 and DCO-2.

The relationship between the frequencies generated by DCO-1 and DECO-2 is demonstrated in FIGS. 4a and 4b of the drawings.

The construction of the Cubic digitally controlled oscillator is demonstrated in FIG. 1. Referring to FIG. 1, the input register accepts a digital word k of n bits. For any particular value of k, a constant amplitude analog sinusoidal waveform of frequency fo will be produced at the output Vo(t). As long as k is a constant word, then Vo(t) will be a fixed frequency. The output frequency becomes:

$$f_o = (K/R)f_s \qquad (32)$$

where $$R = 2^n \qquad (33)$$

Therefore, as the value of k increases, the output frequency increases. Where k represents a word of n bits, for all practical consideration k must be bounded within the limits:

$$0 < k < 2^{n-1}$$

The digitally controlled oscillator consists of five basic elements: an input register 2; an accumulator 4 including an adder 6 and a register 8; a phase to amplitude converter 10 including a register 12; a digital to amplitude converter 14; and a low pass filter 16. The input register 2 allows the output to be updated to a new k value when the update frequency clock 18 is applied. Therefore, each time the update frequency clock 18 goes high, the value of k at the input to the input register 2 is stored in the register and the digitally controlled oscillator will begin to generate the frequency demanded by the stored value of k.

The accumulator 4 is a simple digital adder which takes the output word w and adds it to the stored input k value every time the clock 20 goes high. For all practical purposes, the clock frequency fs will be at least two times higher than the highest frequency produced at the output Vo(t) in accordance with the Nyquist Theorem. The word w will keep increasing until it gets too large where it will overflow and become a small value. This procedure continues resulting in a series of digital numbers representing a ramp function [see FIG. 2(a)].

The phase to amplitude converter 10 takes each value, which represents the angle of a sine wave, from the accumulator 4 and converts it to the amplitude representation of a sine wave designated by A, where A equals sine (w).

This value of A is latched by register 12 and the output waveform takes the shape shown in FIG. 2(b). The phase to amplitude converter 10 consists of a ROM containing a phase to amplitude lock-up table.

In the digital to amplitude converter 14, each amplitude digital word is converted to an analog voltage which exists for the time duration fs of the clock 20. FIG. 2(b) shows the input and FIG. 2(c) shows the output of the D/A converter in correct time relationship to the accumulator output W.

Figure 2:
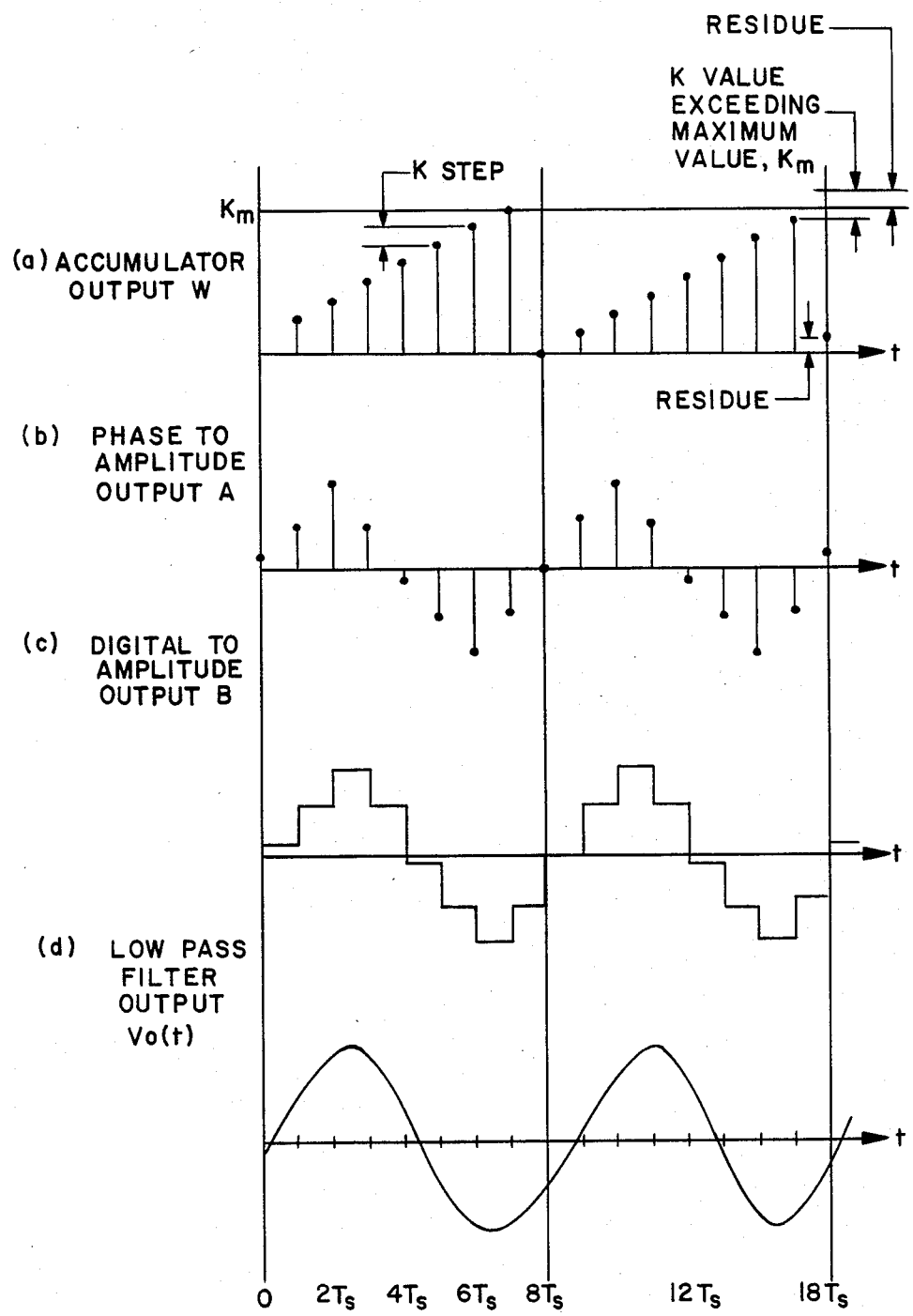
FIG. 2 is a diagram of waveforms demonstrating the operation of the digitally controlled oscillator of FIG. 1.

The low pass filter for some applications, like the present one, is not needed since it exists in other parts of the system as a band pass filter. In any case, a filter is needed to eliminate the undesirable frequencies caused by the digital sampling process of the digitally controlled oscillator. FIG. 2 illustrates the appearance of the analog waveform 2(c) before and 2(d) after filtering by low pass filter 16.

Figure 3:
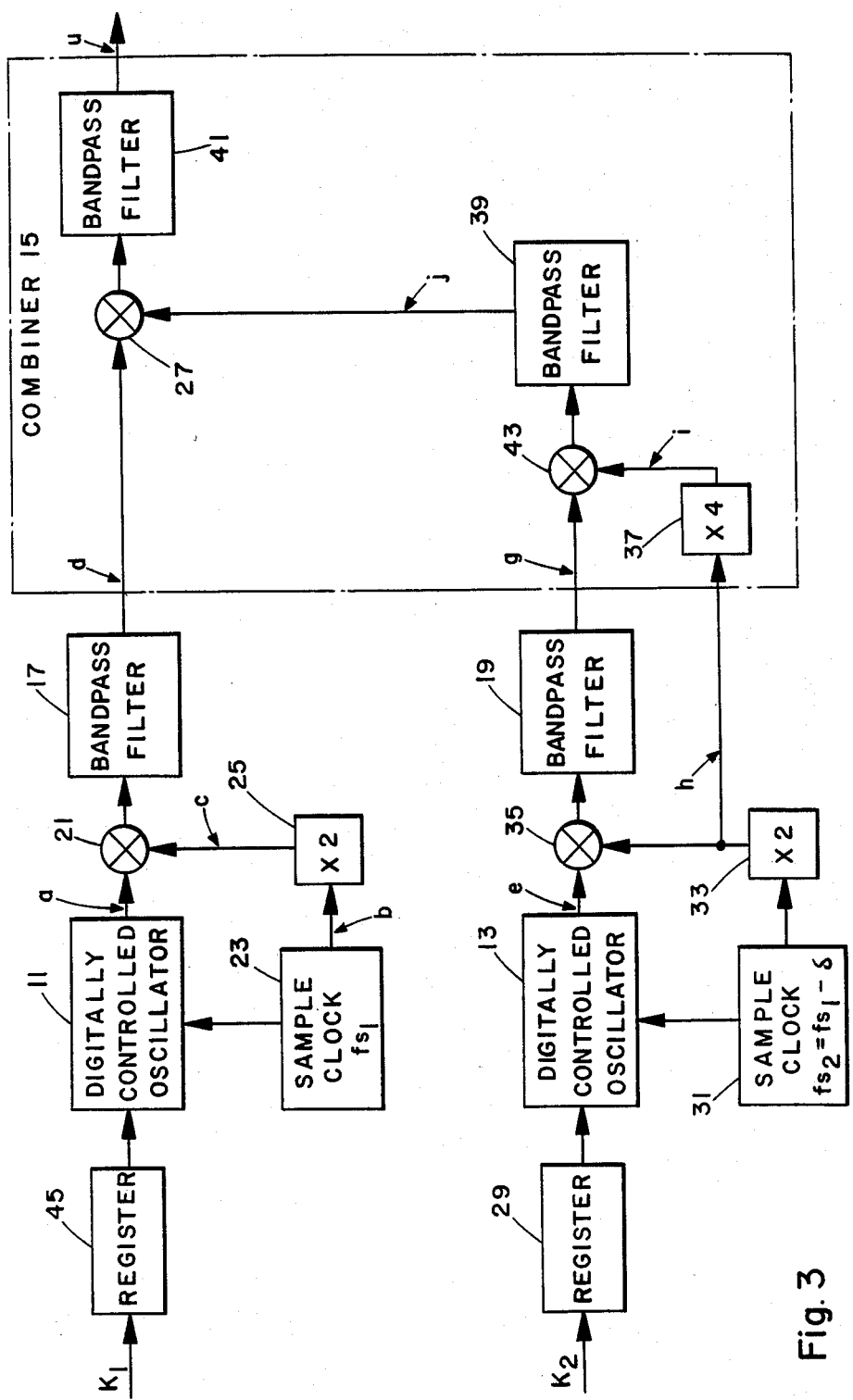
FIG. 3 is a block diagram of the frequency generator of the present invention.

FIG. 3 shows the construction of the frequency generator of the present invention. DCO-1 is indicated at 11 and DOC-2 is indicated at 13. These digitally controlled oscillators are of the type explained above with the exception that the low pass filter section is replaced with the combiner 15 and band pass filters 17 and 19. Outputs of the band pass filters 17 and 19 are connected to the combiner 15.

Digitally controlled oscillator 11 for the example used has a frequency output of 5 Megahertz plus or minus 2.5 Megahertz at a determined by the input from register 45, and this signal is fed to mixer 21. Clock 23 has a sample frequency of 20 Megahertz + Rδ at b. In this example, Rδ is 78.431 Hertz so that the output at 6 is 20,078,431 Hertz. This frequency is doubled by frequency multiplier 25 to a frequency of 40,156,862 Hertz at c which is then fed into mixer 21 and mixed with the 5 ± 2.5 Megahertz signal from digitally controlled oscillator 11. Band pass filter 17 passes a signal of 45,156,862 Hertz plus or minus 2.5 Megahertz at d to mixer 27 in combiner 15.

Register 29 is connected to digitally controlled oscillator 13. Digitally controlled oscillator 13 produces a signal of 5 Megahertz plus or minus 2.5 Megahertz at e. A clock 31 samples the digitally controlled oscillator 13 at a rate of 20 Megahertz. This signal is passed through frequency multiplier 33 to mixer 35 where it is mixed with the signal from digitally controlled oscillator 13. Output of mixer 35 is fed through band pass filter 19 and produces a signal of 45 Megahertz plus or minus 2.5 Megahertz at g.

The signal from frequency multiplier 33 produces at h a frequency of 40 Megahertz that passes through frequency multiplier 37 which multiplies the frequency by 4 resulting in a signal at i of 160 Megahertz which is passed to mixer 43. The output of mixer 43 is connected to band pass filter 39. The output of band pass filter 39 at j is 205 Megahertz plus or minus 2.5 Megahertz and this is fed to mixer 27 where it is mixed with the signal from band pass filter 17. Mixer 27 is connected to band pass filter 41 and the output at u is 250,156,862 Hertz plus or minus 2.5 Megahertz. For every value of $K_1$ and $K_2$ there is a specific frequency at the output of the device.

This particular arrangement produces 130,560 frequencies evenly spaced by 153.2 Hertz in a 5 Megahertz bandwidth. Switching speed is extremely rapid, and resolution is excellent.

Having thus described my invention, I claim:

1. A frequency generator capable of producing a large number of evenly spaced frequencies over a wide band, comprising:

a first digitally controlled oscillator that oscillates at a first frequency;

first register means for applying a digital input to said first digitally controlled oscillator;

first clock means for sampling said first digitally controlled oscillator at a first sampling frequency;

first frequency multiplying means connected to said first clock means for providing a first multiplied frequency that is a multiple of said first sampling frequency;

first mixing means electrically connected to said first digitally controlled oscillator and said first frequency multiplying means for mixing said first digitally controlled oscillator output frequency and said first multiplied frequency;

first filter means electrically connected to said first mixing means for passing a first selected band of frequencies;

a second digitally controlled oscillator for oscillating at a second frequency;

second register means for applying a digital input to said second digitally controlled oscillator;

second clock means for sampling said second digitally controlled oscillator at a second sampling frequency that is different than said first sampling frequency;

second frequency multiplying means for providing a second multiplied frequency that is a multiple of said second sampling frequency;

second mixing means electrically connected to said second digitally controlled oscillator and said second frequency multiplying means for mixing said second digitally controlled oscillator output frequency and said second multiplied frequency;

second filter means electrically connected to said second mixing means for passing a second selected band of frequencies; and combiner means for combining said first selected band of frequencies and said second selected band of frequencies and producing through output filter means any one of a large band of closely and evenly spaced frequencies in accordance with the selection at the first and second register means.

2. A frequency generator according to claim 1 wherein said second frequency multiplying means includes a plurality of frequency multipliers electrically connected with said second clock means, said frequency multipliers being electrically connected through mixers and filters with said second digitally controlled oscillator signal.

3. A frequency generator in accordance with claim 1 wherein said first multiplying means doubles said first clock frequency;

said second multiplying means doubles said second clock frequency;

third multiplying means multiplies the frequency from the output of said second multiplying means by four;

third mixing means mixes the output of the second filter means and the third multiplying means; and third filter means electrically is connected to the output of said third mixer means and also connected with fourth mixing means, said fourth mixing means being electrically connected to said output filter means.

4. A frequency generator according to claim 3 wherein said first clock means has a frequency on the order of about 20 Megahertz;

said second clock means has a frequency that differs from said first clock frequency by a factor $R\delta$.

5. A frequency generator according to claim 1 wherein the first digitally controlled oscillator and the second digitally controlled oscillator have the same output bandwidth.

6. The method of generating a large number of closely and evenly spaced frequencies one at a time over a broad band, comprising the steps of:

sampling each of two digitally controlled oscillators at a different sampling rate so that the frequency spacing of the first digitally controlled oscillator is equal to the frequency spacing of the second digitally controlled oscillator plus a constant; and mixing and filtering the frequencies from said first and second digitally controlled oscillators to produce a maximum number of frequencies within the band having a spacing equal to a different constant.

7. The method of generating a large number of closely and evenly spaced frequencies one at a time over a broad band according to claim 6 wherein the two digitally controlled oscillators have the same output bandwidth.

* * * * *